United States Patent
Reineccius

(10) Patent No.: US 8,368,386 B2
(45) Date of Patent: Feb. 5, 2013

(54) METER SOCKET CONNECTION METHODS AND SYSTEMS FOR LOCAL GENERATORS OR MONITORING CONNECTIONS

(75) Inventor: Stacey Reineccius, San Francisco, CA (US)

(73) Assignee: STEM, Inc., San Francisco, CA (US)

( * ) Notice: Subject to any disclaimer, the term of this patent is extended or adjusted under 35 U.S.C. 154(b) by 253 days.

(21) Appl. No.: 12/716,258

(22) Filed: Mar. 2, 2010

(65) Prior Publication Data

US 2010/0225305 A1 Sep. 9, 2010

Related U.S. Application Data

(60) Provisional application No. 61/157,177, filed on Mar. 3, 2009.

(51) Int. Cl.
*G01R 7/00* (2006.01)
*G01R 1/04* (2006.01)

(52) U.S. Cl. .................... 324/142; 324/156; 324/157

(58) Field of Classification Search .................... None
See application file for complete search history.

(56) References Cited

U.S. PATENT DOCUMENTS

| | | | |
|---|---|---|---|
| 4,121,147 A | 10/1978 | Becker et al. | |
| 5,595,506 A | 1/1997 | Robinson et al. | |
| 5,620,337 A | 4/1997 | Pruehs | |
| 6,015,314 A * | 1/2000 | Benfante | 439/517 |
| 6,059,605 A | 5/2000 | Robinson et al. | |
| 6,200,158 B1 | 3/2001 | Robinson | |
| 6,420,801 B1 | 7/2002 | Seefeldt | |
| 7,019,666 B2 * | 3/2006 | Tootoonian Mashhad et al. | 340/870.02 |
| 7,157,810 B2 | 1/2007 | Kanouda et al. | |
| 7,199,527 B2 * | 4/2007 | Holman et al. | 313/511 |
| 2002/0019758 A1 | 2/2002 | Scarpelli | |
| 2002/0171436 A1* | 11/2002 | Russell | 324/602 |
| 2004/0263116 A1 | 12/2004 | Doruk et al. | |
| 2007/0117436 A1 | 5/2007 | Davis | |
| 2007/0200433 A1 | 8/2007 | Kelty | |

OTHER PUBLICATIONS

International Search report for PCT/US2010/025982 search report dated Oct. 28, 2010.

* cited by examiner

*Primary Examiner* — Vinh Nguyen
(74) *Attorney, Agent, or Firm* — Patterson & Sheridan, LLP

(57) ABSTRACT

Systems and methods for interconnecting local generation or power monitoring systems to a residential or commercial electric power system so that the connection is made via a direct connection to the power meter socket on the consumer side of the meter. The breaker for the system may be collocated with the interconnection. The system allows for a quick interconnection of the local generation or power monitoring system by inserting an attachment, or shim, underneath the existing standardized meter for simplified power connection, measurement and communications. The attachment may include integrated measurement coils or sensors connected to built-in power management electronics, a control computer, and/or a powerline communications module.

18 Claims, 8 Drawing Sheets

Meter Socket: Upper socket to provider, lower sockets to customer, center sockets are neutral

METER SOCKET CONNECTION METHODS AND SYSTEMS FOR LOCAL GENERATORS OR MONITORING CONNECTIONS

CROSS-REFERENCE

This application claims the benefit of U.S. Provisional Patent Application No. 61/157,7177, filed Mar. 3, 2009, which application is incorporated herein by reference in its entirety.

BACKGROUND OF THE INVENTION

Current electricity installations for residences or commercial locations are measured for their power consumption using standardized meters (watt-hour meters) which are inserted in standardized meter sockets. These sockets are comprised of standardized pins and sockets through which the various electrical interconnections from the electricity provided by a local electricity utility is passed through a meter and then delivered to the consumer. There are often multiple meters serving a single physical location.

In a standard meter, there is one side that serves as a conduit to an electricity provider (the "provider side") and another side that is the conduit to supplying electricity to the premise or location that it services (the "consumer side"). The consumer side of the meters is usually wired to a panel box where the power flowing through the meter is distributed to the physical interior of the premise or consumer for use by the various loads and equipment of the consumer.

If a local generation system is to be used, currently, it may be connected to the panel box via a new conduit to the panel box. This new conduit source may be from the output of a grid compatible inverter, where it is connected to a new breaker on the premise's distribution panel. The new breaker must be sized according to the capacity of the panel box rating and the other loads present at the location or premise.

Current generations of systems for energy management, power management and performance measurement typically require an ability to measure the load (current, watts, KVAR, etc.) coming into a premise and usually this is difficult to access due to the limitations and security limits of existing electrical meters. The current practice requires current sensing coils to be somehow located and installed around existing wire and for voltage taps to be securely placed. Problems with physical access, variety of sizes and access issues typically arise.

This current practice has numerous flaws which results in longer than needed labor times and greater complexity of installation. For example, systems often may not be connected to local or renewable generators, advanced electrical storage or high current applications such as electric cars, because they have no physical space for an extra breaker or panel. In addition, there is often a need to reduce the size or cost of systems because of inadequate current capacity in existing panel boxes. Further, extra labor and design time is required up front to analyze and minimize costs and old systems often have to be completely replaced due to inability to locate available spare parts. Therefore, the present invention addresses these needs for simpler and faster interconnect means that allow for lower cost installation to more locations with less pre-planning and shorter lead times to accomplish the interconnect that can handle potentially more locally generated power.

Therefore, there exists a need for a simpler and faster interconnect means that allows for lower cost installation to more locations with less pre-planning and shorter lead times to accomplish the interconnect that can handle potentially more locally generated power.

SUMMARY OF THE INVENTION

The invention provides for meter socket connection methods and systems for use of local generators or monitoring of the connection. Various aspects of the invention described herein may be applied to any of the particular applications set forth below. The invention may be applied as a standalone system or as a component of an integrated solution. It shall be understood that different aspects of the invention can be appreciated individually, collectively or in combination with each other.

One aspect of the invention provides a system for interconnecting a watt-hour power meter to a local generator inverter. The system includes a watt-hour power meter for measuring power consumption and a meter socket positioned between a conduit to an electrical power provider and a conduit to an electrical power consumer. In addition, the system also includes a meter socket insert between the power meter and the meter socket. The meter socket insert may be formed with ports and connected to a local generator inverter.

In one aspect of the invention, the system further includes a powerline based communication network for measuring power consumption of a plurality of devices within reach of a powerline.

Other goals and advantages of the invention will be further appreciated and understood when considered in conjunction with the following description and accompanying drawings. While the following description may contain specific details describing particular embodiments of the invention, this should not be construed as limitations to the scope of the invention but rather as an exemplification of preferable embodiments. For each aspect of the invention, many variations are possible as suggested herein that are known to those of ordinary skill in the art. A variety of changes and modifications can be made within the scope of the invention without departing from the spirit thereof.

INCORPORATION BY REFERENCE

All publications, patents, and patent applications mentioned in this specification are herein incorporated by reference to the same extent as if each individual publication, patent, or patent application was specifically and individually indicated to be incorporated by reference.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings of which:

DETAILED DESCRIPTION OF THE INVENTION

In the following detailed description, numerous specific details are set forth in order to provide a thorough understanding of the invention. However it will be understood by those of ordinary skill in the art that the invention may be practiced without these specific details. In other instances, well-known methods, procedures, components and circuits have not been described in detail so as not to obscure the invention. Various modifications to the described embodiments will be apparent to those with skill in the art, and the general principles defined herein may be applied to other embodiments. The invention is not intended to be limited to the particular embodiments shown and described.

Embodiments of the present invention relate to the process of interconnecting local renewable energy generation and 'smart monitoring' systems to a local utility power grid. Embodiments of the present invention may lower the cost of interconnection and speed up the process of installation for local generation systems such as solar, wind or fuel cells to existing standardized power meters. For example, a local generator may be a solar, wind or any kind of generator, and the inverter of the local generator may be connected to a power meter, as described in embodiments of the present invention. Embodiments of the present invention may also allow for interconnection of locally monitored power demand management systems to such existing standardized power meters, whether a smart meter or a legacy meter.

Figure 1A:
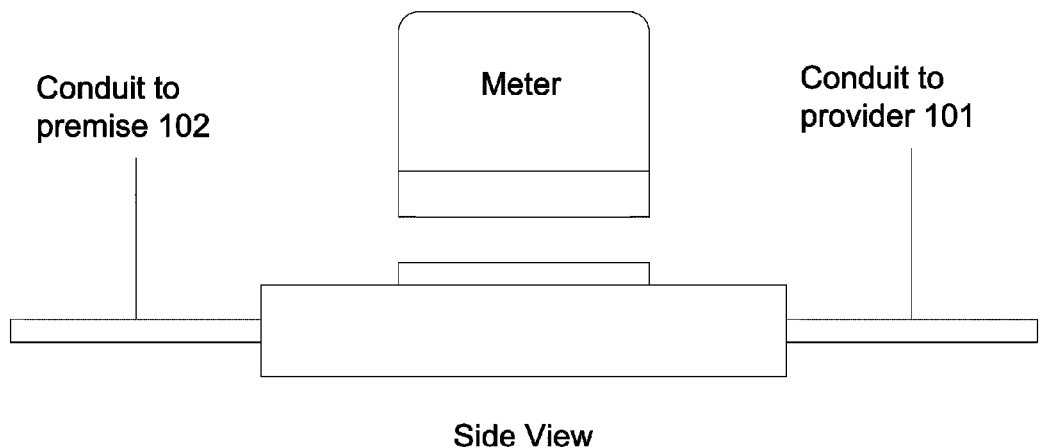
FIG. 1A illustrates a side view of a current watt-hour power meter and meter socket.
Figure 1B:
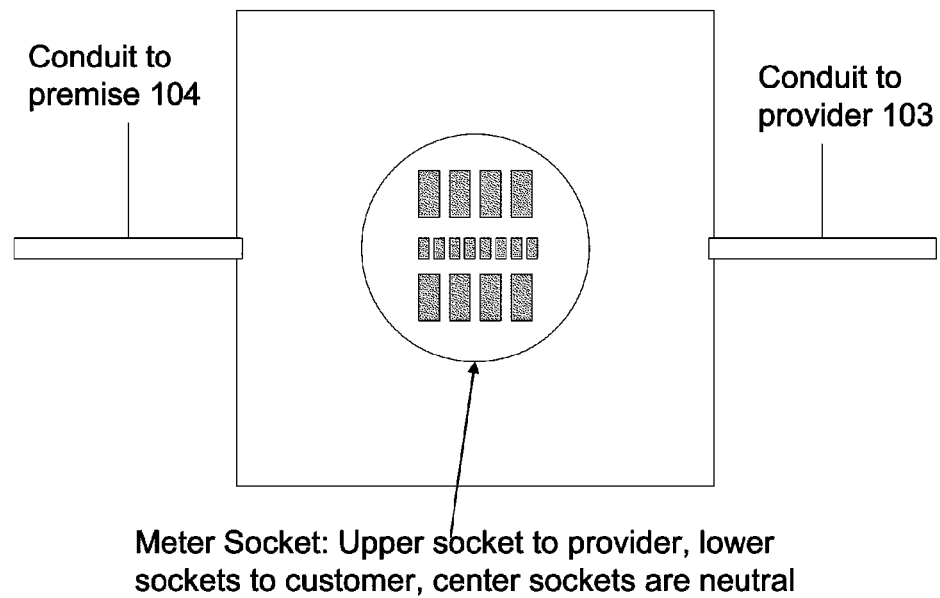
FIG. 1B illustrates a view of a current watt-hour power meter socket receptacles and pins.

Referring to FIG. 1A, a power meter, built and configured according to existing standards, is illustrated. An existing standardized meter generally has one conduit to a local electricity utility company (provider) 101 and another conduit to a residence or commercial location (premise) 102. The meter then functions to measure the amount of power provided by the provider and consumed by the premise. Referring to FIG. 1B, the meter socket, built and configured according to existing standards, is illustrated. The interior of the meter socket contains, generally three rows of sockets: one for the provider side 103, one for neutral sockets, and one for the consumer side 104. The various phases for each are handled by one receptacle within each row and are matched to one pin built into the meter. These receptacle and pins are standardized and various meter manufacturers and receptacle manufacturer's product interoperate today with certification from Underwriters Laboratories.

Typically, a power source may provide electrical power service to a residential or commercial building site over two to three incoming line conductors. The line conductors are connected to a standard electric meter socket. In addition, a neutral line conductor extends from the power source to the meter socket. Typically, the meter socket is mounted to a wall of the building site. In order to measure the electrical power consumed by the building site, a watt-hour meter is removably attached to the meter socket.

A standard power (or watt-hour) meter includes a first pair of line contacts (line jaw contacts) and a second pair of load contacts (load jaw contacts). The line jaw contacts are positioned above the load jaw contacts, and a neutral jaw contact is located in the housing between the upper and lower line jaw contacts. The ends of the line conductors terminate at the line jaw contacts, and the load jaw contacts are attached to the electrical distribution wiring system of the building site. Thus, the meter includes a pair on line contacts and a pair of load contacts, and also a neutral blade contact. Each of these blade contacts are configured for being removably engaged to the jaw contacts of the meter socket. Therefore, each blade contact may resemble an elongated thin blade. When the watt-hour meter and the meter socket are connected together, an electrical circuit is completed so that electrical energy can pass from the line contacts to the load contacts for distribution to the building site. Energy consumption may also be measured as the energy passes through the meter.

Figure 2:
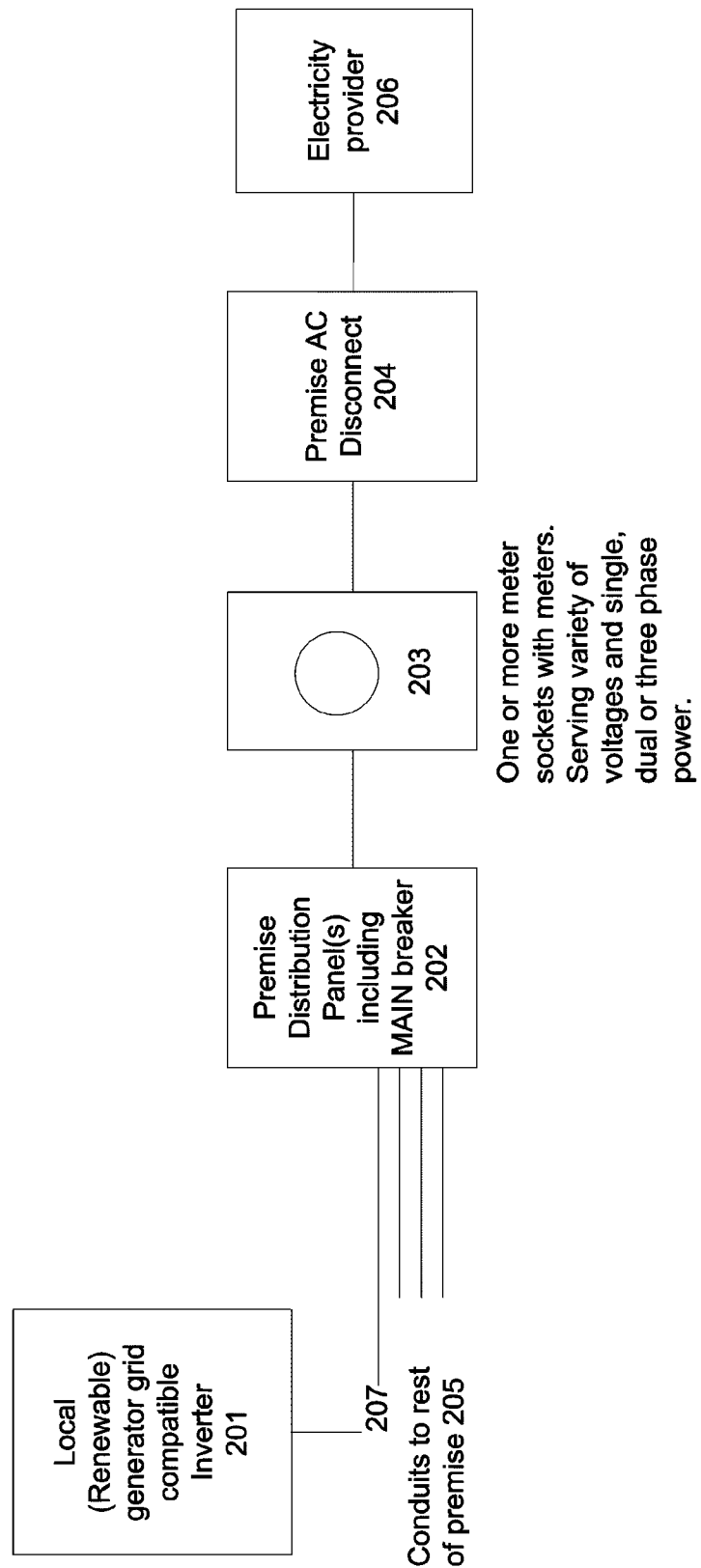
FIG. 2 illustrates the architecture of a current configuration of a watt-hour meter and meter socket.

Referring to FIG. 2, an architectural overview of how a utility or power meter is configured in a typical home or building (or premise) is illustrated. Generally, in current configurations, when configuring a local or renewable generator grid, a compatible inverter 201 must be connected through the premise's distribution panel box 202. Thus, a new conduit 207 to the panel box from the output of a grid compatible inverter must be formed. This is normally accomplished by connecting a new breaker (within 202), sized according to the capacity of the panel box rating and other loads present within the premise. The local generator grid compatible inverter 201 output is fed into a new breaker (within 202) on the premise's distribution panel 202, which is then connected to a meter socket 203 on the consumer side.

The incoming AC power line 204 then passes through the utility company meter 206 on its way to one or more breaker boxes before being generally distributed throughout the home or building through conventional power wiring 205. Output from a local generator grid compatible inverter 201 must also pass through the breaker box (within 202). This current practice has numerous flaws which result in longer than needed labor times and greater complexity of installation, as discussed above.

Figure 3A:
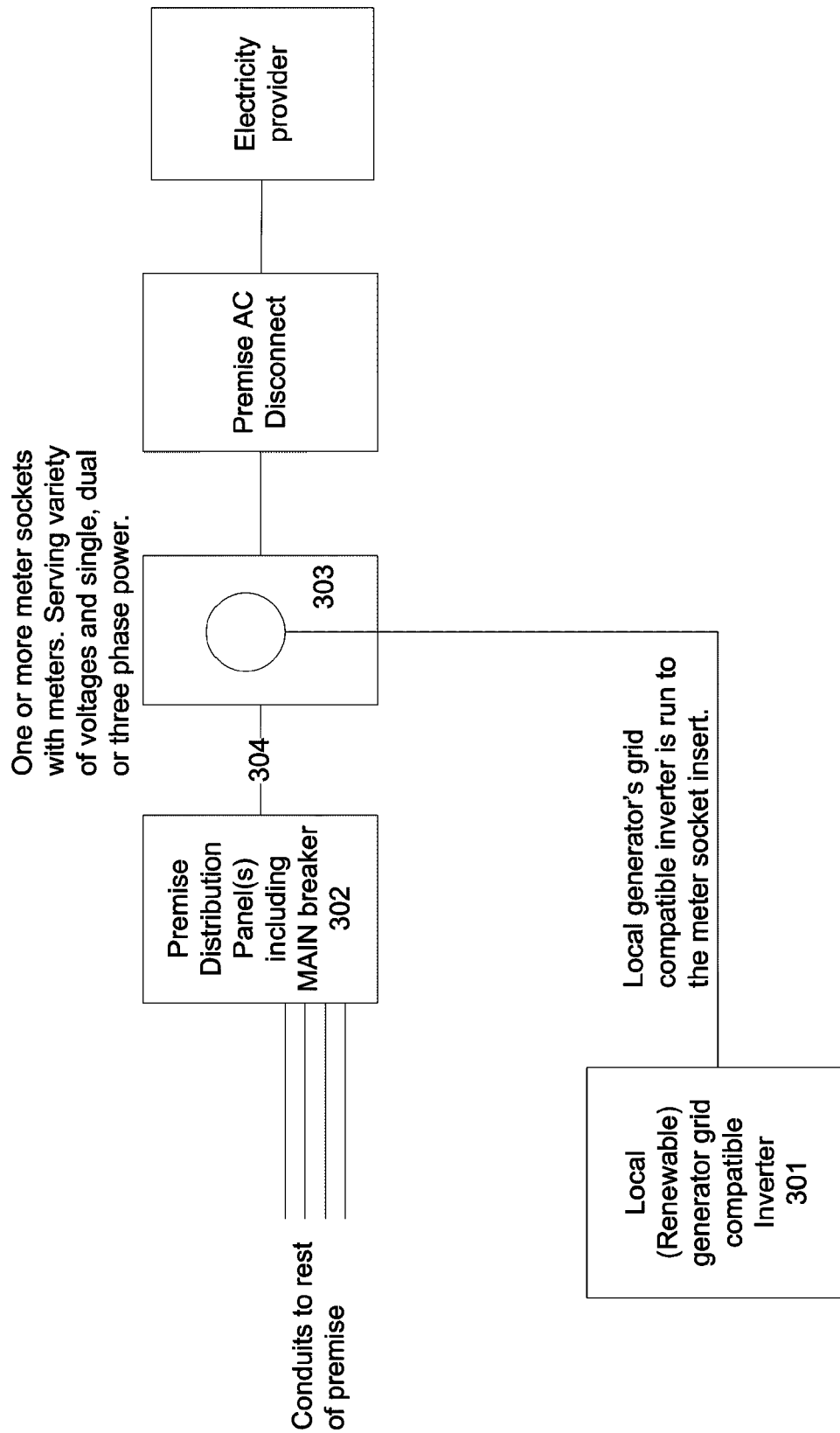
FIG. 3A illustrates one example of an architecture of a watt-hour power meter and meter socket with an adapter, in accordance with embodiments of the present invention.

In contrast, referring to FIG. 3A, the local (renewable) generator grid compatible inverter 301 may bypass the breaker box on the premise's distribution panel 302, and may be run to a socket adapter (or shim) 303 as illustrated in embodiments of the present invention. Thus, a new breaker on the premise's distribution panel 302 is no longer necessary. The socket adapter (or shim) 303 may be a meter socket insert. On the consumer side, the same housing and existing approved breakers 302 may be incorporated, so there is no need to expand, replace or install a new breaker panel box. The existing conduit 304 from the distribution panel to the consumer side of the meter may also be utilized so there is no need to make any alterations to such conduit. Thus, instead of requiring a new breaker, the local (renewable) generator grid compatible inverter 301 may be run directly to a socket adapter (or shim) 303.

Figure 3B:
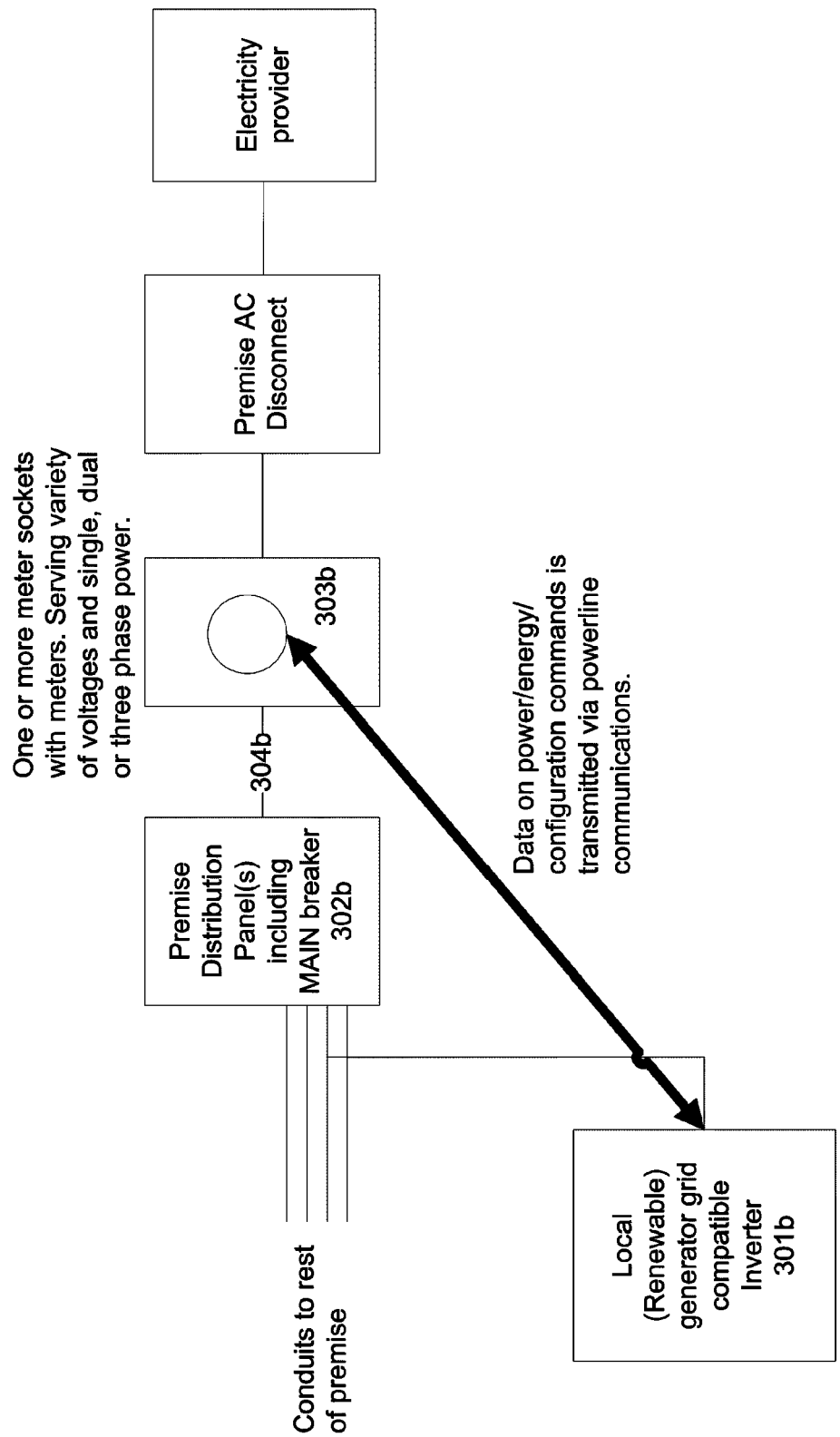
FIG. 3B illustrates one example of an architecture of a watt-hour power meter and meter socket with an adapter using powerline communications to deliver data, commands, and configuration controls, in accordance with embodiments of the present invention.

In contrast, referring to FIG. 3B, a local (renewable) generator grid compatible inverter 301b may be connected to a breaker box on the premise's distribution panel 302b, and communications between a unit (such as a storage unit or intelligent power management system) may run to a socket adapter (or shim) 303b as illustrated in embodiments of the present invention, via powerline communications. Thus, there is no longer a need for separate wiring to each device with a premise. The socket adapter (or shim) 303b may be a meter socket insert, and, for example, an intelligent power management unit may be embedded within the meter socket insert 303b as described below. Each meter socket insert 303b may include microprocessors that measure power, and the local renewable generator, storage unit or other device on the consumer's premise utilize such measurements for obtaining timely information on the power load of the consumer's premise. On the consumer side, the same housing and existing approved breakers may be incorporated, so there may be no need to expand, replace or install a new breaker panel box. The existing conduit 304b from the distribution panel 302b to the consumer side of the meter may also be utilized so there is no need to make any alterations to such conduit.

Figure 4A:
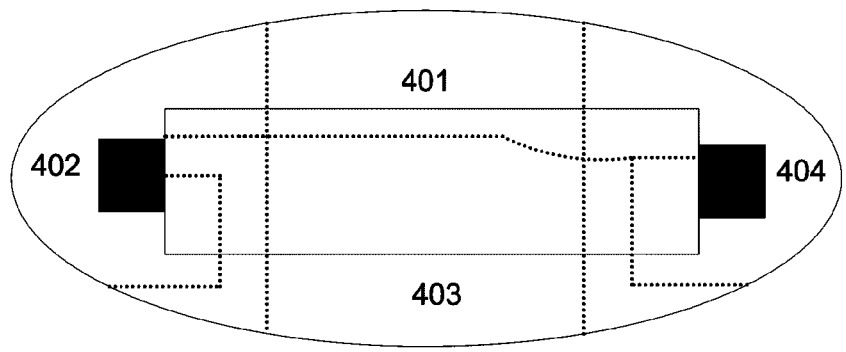
FIG. 4A illustrates an adapter to be positioned between a watt-hour power meter and meter socket, in accordance with embodiments of the present invention.

Referring to FIG. 4A, a shim or adapter that may be placed between the current meter and the current socket is shown. The adapter (or shim) has a meter side 401, which is the side connected to the meter, and a socket side 403, which is the side connected to the socket. The adapter (or shim) also has a consumer side 402, which is the side of the conduit to the premise. An alternate consumer side 404 may provide an additional breaker connection or conduit to the premise for physical access in case of any obstructions to 402.

Figure 4B:
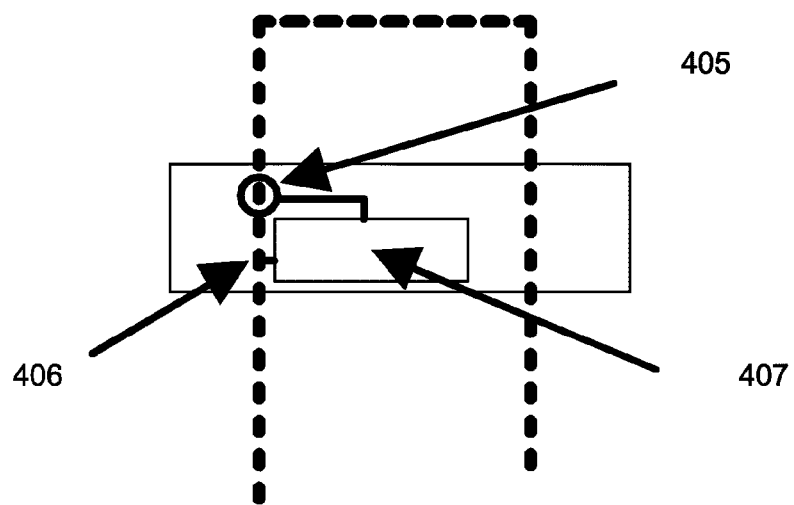
FIG. 4B illustrates an example of an adapter positioned between a watt-hour power meter and meter socket and connected to powerline and measurement electronics, in accordance with embodiments of the present invention.

Referring to FIG. 4B, a shim or adapter that may be placed between the current meter and the current socket is shown. The adapter (or shim) may have integrated measurement coils or sensors 405, which are connected to built-in power measurement electronics, control computer and powerline communications module 407. Voltage taps 406 located on the customer side of the meter power measurement may be used for at least three purposes including voltage measurement, providing power to a built-in power measurement electronics, control computer and/or powerline communications module 407, as well as to provide a connection for the powerline communications electronics to a powerline.

Thus, to elaborate further, another aspect of the invention is the inclusion of a form of powerline based communication network. The network may conform to a standard such as the HomePlug standard (IEEE 1901 draft standard for powerline communications or other equivalent) to communicate with an integrated power measurement and data logging capability. For example, the network may be able to measure power consumed or required by certain devices or appliances that are plugged into the network (or within reach of a certain power line or network of power lines) or other data relating to devices or appliances on the network. The data and information that is measured and collected may be communicated to other devices within the premise or within the reach of the power line for various purposes including control, measurement and configuration.

Figure 5A:
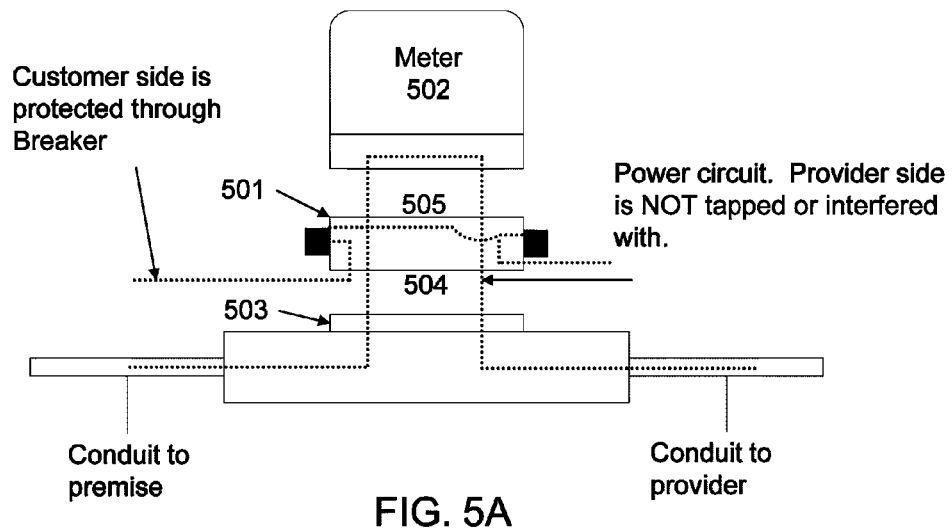
FIG. 5A illustrates an embodiment of the adapter as positioned between a watt-hour power meter and meter socket, in accordance with embodiments of the present invention.

Referring to FIG. 5A, a shim or adapter 501 may be placed between the current meter 502 and the current socket 503. The "meter side" 505 has a series of compatible receptacles to the meter, and the "socket side" 504 has a series of compatible pins to plug into the current socket. The adapter 501 may be safely and easily employed to bridge the meter 502 and the socket 503. The adapter 501 positioned between the meter 502 and the socket 503 may include a line conductor and a pair of load conductors. The line conductor may have a first end configured for being connected to one of the line jaw contacts of the watt-hour meter socket and a second end for being connected to one of the blade contact of the watt-hour meter. Each load conductor may have a first end configured for being engaged by jaw load contacts of the watt-hour meter socket and a second end for being connected to blade contacts of the watt-hour meter. In addition, the neutral conductor may have a first end configured for being engaged by jaw neutral contact and a second end for being connected to blade contact of the watt-hour meter. A means for securing, e.g., a cotter pin, may also be employed to secure the line conductor or load conductor. It can be appreciated that any type of contact configuration may be employed herein so long as electrical contact sufficient to handle the load can be made between the elements.

Figure 5B:
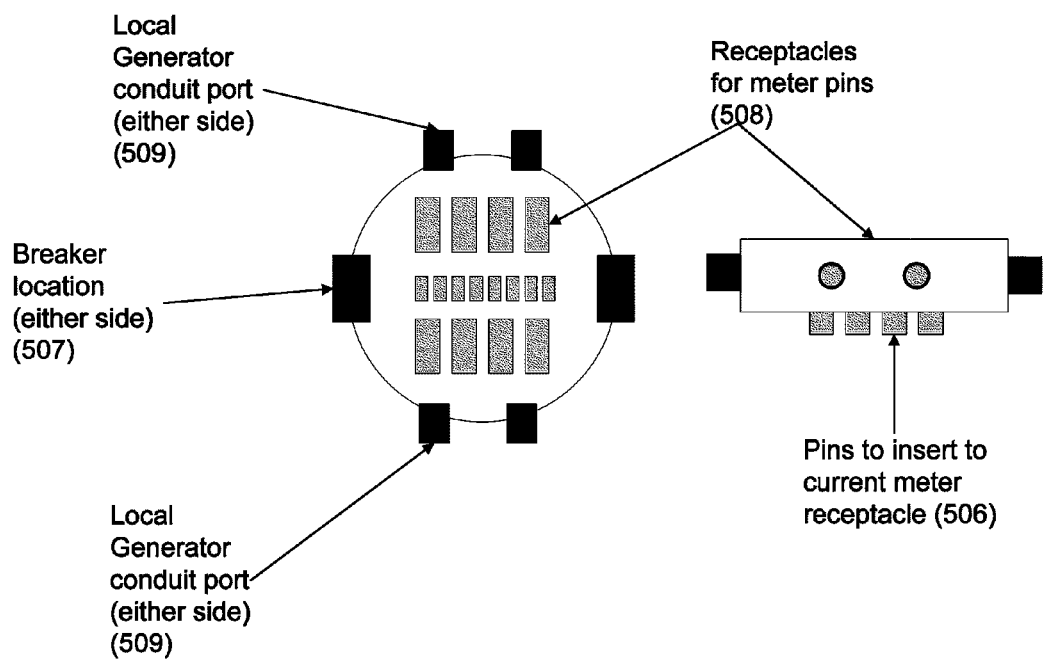
FIG. 5B illustrates the meter-side of the adapter, in accordance with embodiments of the present invention.

In FIG. 5B, the "meter side" of the shim or adapter is shown. As shown in FIG. 5B, the pins 506 on the consumer side of the shim or adapter are wired such that they feed to an electric breaker or fuse suitable for interconnection to the provider's grid. The supply side of the breaker (line conductor) 507 may be connected to the receptacles 508 of the shim or adapter, and the load side of the breaker (pair of load conductors) 507 may be connected to the wires coming from one or more of the conduit ports at the top or bottom of the shim or adapter, and which run to the outputs of the local generation facility (local generator conduit port) 509.

Figure 6:
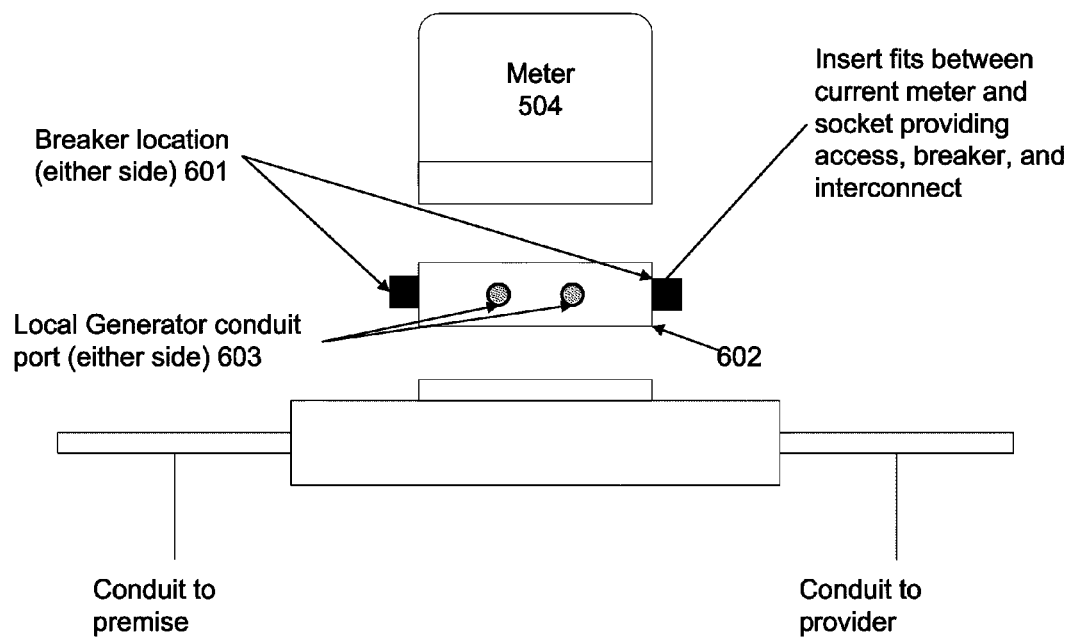
FIG. 6 illustrates an embodiment of the adapter as positioned between a watt-hour power meter and meter socket, in accordance with embodiments of the present invention.

Referring to FIG. 6, the breaker 601 may be connected to either side of the shim or adapter 602. Further, as shown, local generator conduit ports 603 may be at the top or bottom of the shim or adapter, and may run to the outputs of a local generation facility. Thus, the local generation resource may be connected to the meter 604, without having to connect to a new breaker on the existing breaker panel.

Figure 7:
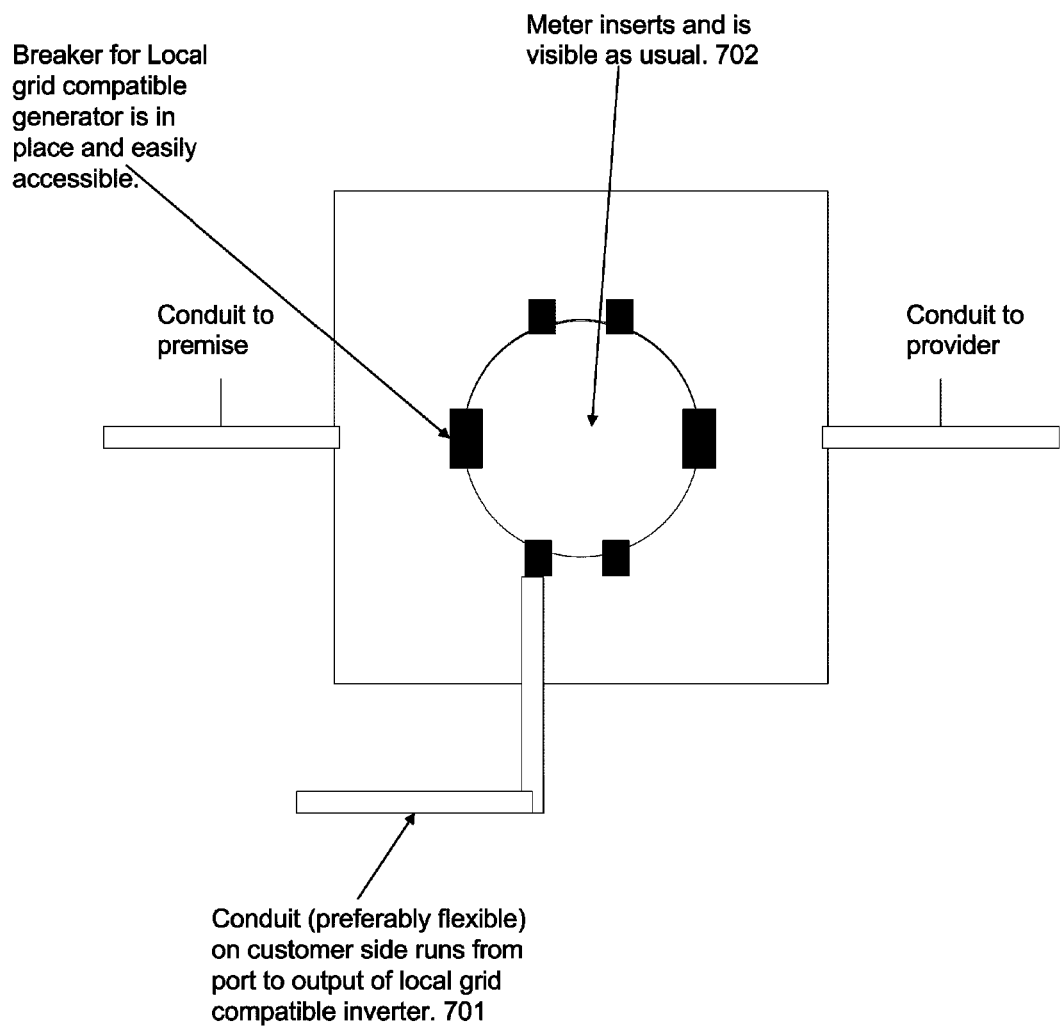
FIG. 7 illustrates the socket-side of the adapter, in accordance with embodiments of the present invention.

Referring to FIG. 7, the "socket side" of the shim or adapter is shown. As shown in FIG. 7, the conduit 701, which is preferably a flexible conduit, on the consumer side, runs from the local generator conduit port to the output of a local grid compatible inverter (or local inverter). While a flexible wire may be preferably employed as the connector, any known mechanical means may be used in lieu thereof. For example, the adapter 702 may be manufactured with a non-flexible shunt, e.g., a solid copper bar, to bridge the connection. Further, any mechanical or other known means may be employed to attach the terminal ends of flexible wire from the local generator conduit port to the local grid compatible inverter (or local inverter). For example, chemical bonding may be employed in lieu of the mechanical means described. The conduit to the provider remains the same as it is in standardized meter configurations, thus ensuring the billing accuracy of the utility meter.

Each of the meter sockets discussed above may serve a variety of voltages and single, dual or three phase power. The shim or adapter may be inserted at the same time as the current net metering is swapped out, or alternatively it may be installed in advance of a utility swap. Thus, the provider's meter may remain in the same physical location and operate without change to its accuracy or completeness of data collection. In addition, the advantages of utilizing the shim or adapter as described in embodiments of the present invention would allow for a very quick connection to the full rate power potential for a premise or consumer location by a local generator or other applications such as an electric vehicle charger. Most importantly, embodiments of the present invention utilize existing approved breakers and conduits to reach and connect to the consumer side of standardized power meters, without avoiding having to expand, replace or install a new breaker panel box. A utility worker may easily remove the electric watt-hour meter from the meter socket, and arrange the adapter. Thus, an interconnection may be made where physical requirements for a particular installation may not allow a new panel box to be installed. Where a new panel box would otherwise prevent the ability for a local generator to be interconnected in a cost effective manner, embodiments of the present invention make that interconnection possible, in an efficient, cost-effective way.

In addition, an advantage of embodiments of the present invention is that local premise current and voltage measurement circuitry could be incorporated in the same housing so as to enable a feedback to any local generation or power control or storage equipment to have data on the total usage of the premise even in the absence of an accessible "smart meter" and so expand the locations where the generation, storage or power control system can be installed by eliminating the requirement for an accessible local utility smart meter.

All concepts of the invention may incorporate or integrate concepts utilized by other types of watt-hour meter adapters and inserts including but not limited to those described in U.S. Pat. No. 6,015,314 (Benfante) issued on Jan. 18, 2000, which is hereby incorporated by reference in its entirety.

While preferred embodiments of the present invention have been shown and described herein, it will be obvious to those skilled in the art that such embodiments are provided by way of example only. Numerous variations, changes, and substitutions will now occur to those skilled in the art without departing from the invention. It should be understood that various alternatives to the embodiments of the invention described herein may be employed in practicing the invention. It is intended that the following claims define the scope of the invention and that methods and structures within the scope of these claims and their equivalents be covered thereby.

What is claimed is:

1. A system for interconnecting a power meter to a local generator inverter comprising:
 a meter socket including a plurality of receptacles that correspond to a plurality of pins of the power meter; and
 a socket adapter configured to connect to the meter socket and the power meter, positioned between the power meter and the meter socket, and comprising at least one microprocessor for measuring power consumption of a premises and a powerline communications module for communicating with the local generator inverter.

2. The system of claim 1, further comprising a breaker panel for the premises connected to a consumer side of the meter socket.

3. The system of claim 1, further comprising a powerline based communication network, in communication with the socket adapter, for measuring power consumption of a plurality of devices connected to a power line.

4. The system of claim 3, wherein the powerline based communication network conforms to the IEEE 1901 draft standard for powerline communications.

5. The system of claim 1, the socket adapter further comprising power hour measurement electronics.

6. The system of claim 1, wherein the local generator inverter is connected directly to the socket adapter through ports formed in the socket adapter.

7. The system of claim 1, the socket adapter further comprising voltage taps.

8. The system of claim 7, wherein the voltage taps are utilized to measure a voltage of power supplied to the premises.

9. The system of claim 7, wherein the voltage taps provide power to the powerline communications module.

10. A socket adapter for interconnecting a power meter to a local generator inverter comprising:
 a plurality of pins configured to engage corresponding receptacles of a meter socket;
 a plurality of receptacles configured to engage corresponding pins of the power meter;
 at least one microprocessor for measuring power consumption of a premises; and
 a powerline communications module for communicating with the local generator inverter.

11. The socket adapter of claim 10, wherein a consumer side of the meter socket is connected to a breaker panel for the premises.

12. The socket adapter of claim 10, wherein the powerline communications module is in communication with a powerline based communication network for measuring power consumption of a plurality of devices.

13. The socket adapter of claim 12, wherein the powerline based communication network conforms to the IEEE 1901 draft standard for powerline communications.

14. The socket adapter of claim 10, further comprising power measurement electronics.

15. The socket adapter of claim 10, wherein the local generator inverter is connected directly to the socket adapter through ports formed in the socket adapter.

16. The socket adapter of claim 10, the socket adapter further comprising voltage taps.

17. The socket adapter of claim 16, wherein the voltage taps are utilized to measure a voltage of power supplied to the premises.

18. The socket adapter of claim 16, wherein the voltage taps provide power to the powerline communications module.

* * * * *